(12) United States Patent
Lee et al.

(10) Patent No.: US 10,784,190 B2
(45) Date of Patent: *Sep. 22, 2020

(54) METHOD OF MAKING LEADFRAME STRIP

(71) Applicant: Texas Instruments Incorporated, Dallas, TX (US)

(72) Inventors: Lee Han Meng@Eugene Lee, Johor (MY); Anis Fauzi bin Abdul Aziz, Kedah (MY); Wei Fen Sueann Lim, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/680,499

(22) Filed: Aug. 18, 2017

(65) Prior Publication Data

US 2017/0345743 A1    Nov. 30, 2017

Related U.S. Application Data

(62) Division of application No. 15/004,208, filed on Jan. 22, 2016, now Pat. No. 9,741,643.

(51) Int. Cl.
*H01L 23/495* (2006.01)
*H01L 21/48* (2006.01)
*H01L 21/56* (2006.01)
*H01L 21/78* (2006.01)

(52) U.S. Cl.
CPC .... *H01L 23/49565* (2013.01); *H01L 21/4842* (2013.01); *H01L 21/561* (2013.01); *H01L 21/565* (2013.01); *H01L 21/78* (2013.01); *H01L 23/49503* (2013.01); *H01L 23/49541* (2013.01); *H01L 23/49551* (2013.01); *H01L 2224/97* (2013.01); *H01L 2924/181* (2013.01)

(58) Field of Classification Search
CPC ......... H01L 23/49503; H01L 23/49541; H01L 23/495; H01L 23/49565; H01L 23/49551; H01L 21/4842; H01L 21/561; H01L 21/565; H01L 21/78
See application file for complete search history.

(56) References Cited

U.S. PATENT DOCUMENTS

| | | | |
|---|---|---|---|
| 6,797,540 B1 | 9/2004 | Li et al. | |
| 7,763,958 B1 | 7/2010 | Lim et al. | |
| 7,816,771 B2 | 10/2010 | Shen et al. | |
| 9,741,643 B2* | 8/2017 | Lee | H01L 23/49565 |
| 2001/0030355 A1 | 10/2001 | Mclellan et al. | |
| 2003/0116833 A1 | 6/2003 | Lee et al. | |
| 2005/0012183 A1 | 1/2005 | Chow et al. | |
| 2011/0042793 A1 | 2/2011 | Wong et al. | |
| 2013/0319744 A1 | 12/2013 | Wu et al. | |

* cited by examiner

*Primary Examiner* — Andrew Q Tran
(74) *Attorney, Agent, or Firm* — Dawn Jos; Charles A. Brill; Frank D. Cimino

(57) ABSTRACT

A leadframe strip for use in making leaded integrated circuit packages includes a plurality of integrally connected leadframes that each have a die attach pad and first and second dam bars located adjacent to opposite first and second sides of the die attach pad, respectively. A plurality of continuous lead structures extend, uninterrupted by other structure, between opposing ones of the dam bars of horizontally adjacent leadframes. The plurality of integrally connected leadframes are arranged in a plurality of vertical columns, wherein die attach pads in one vertical column are vertically offset from die attach pads in adjacent vertical columns.

19 Claims, 10 Drawing Sheets

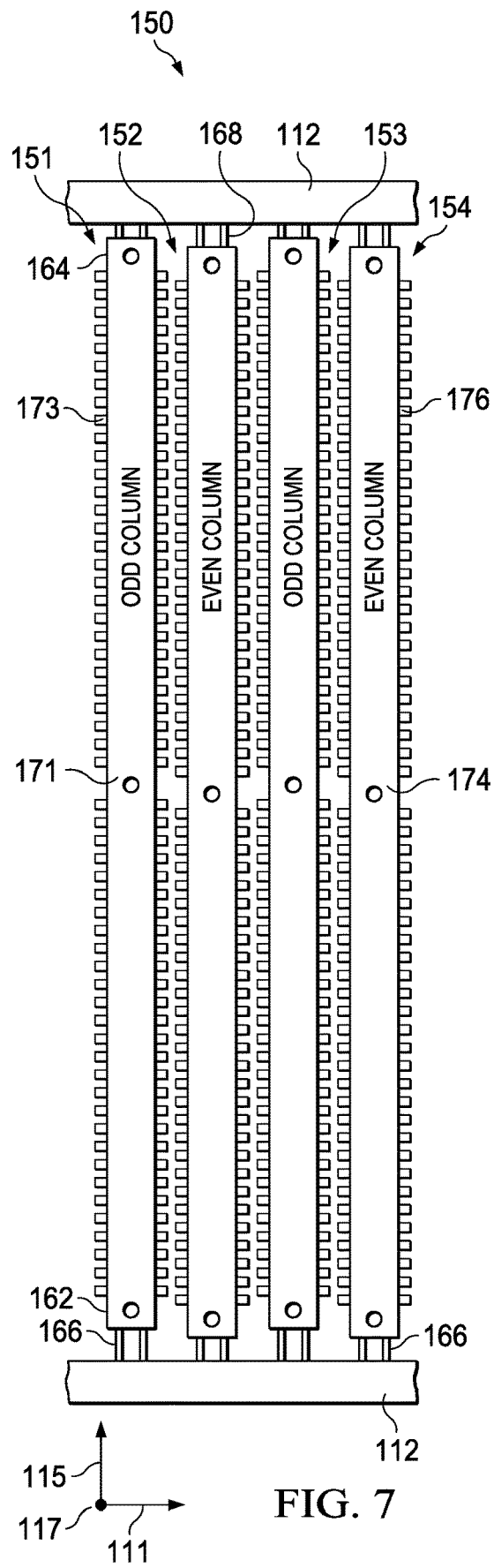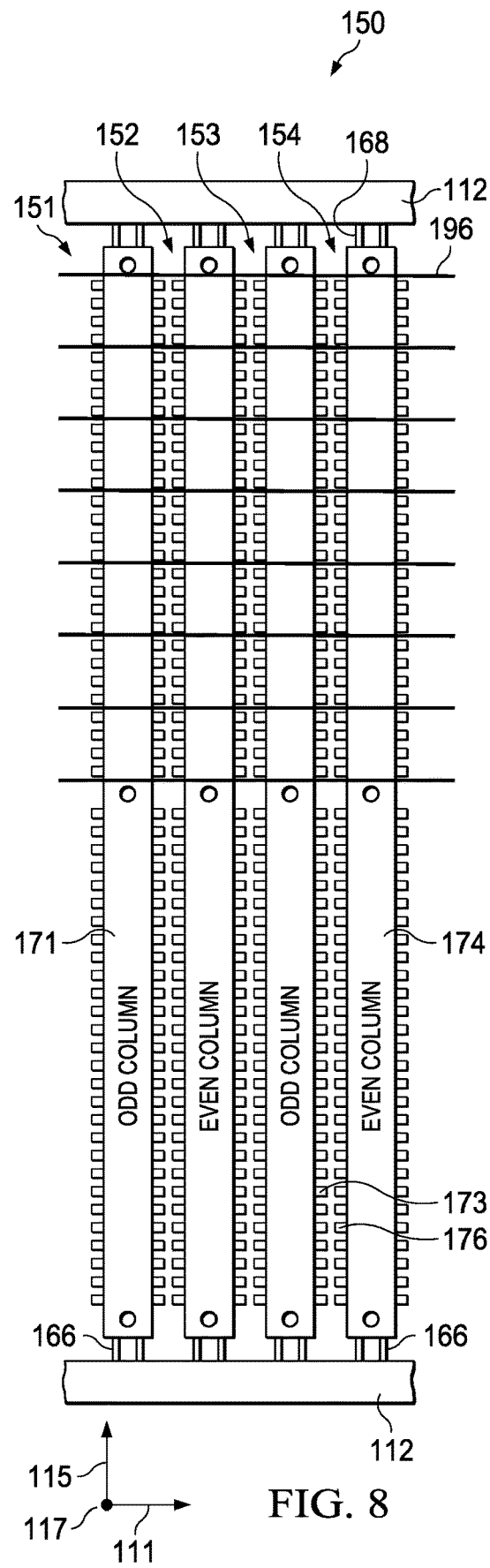
FIG. 7
FIG. 8

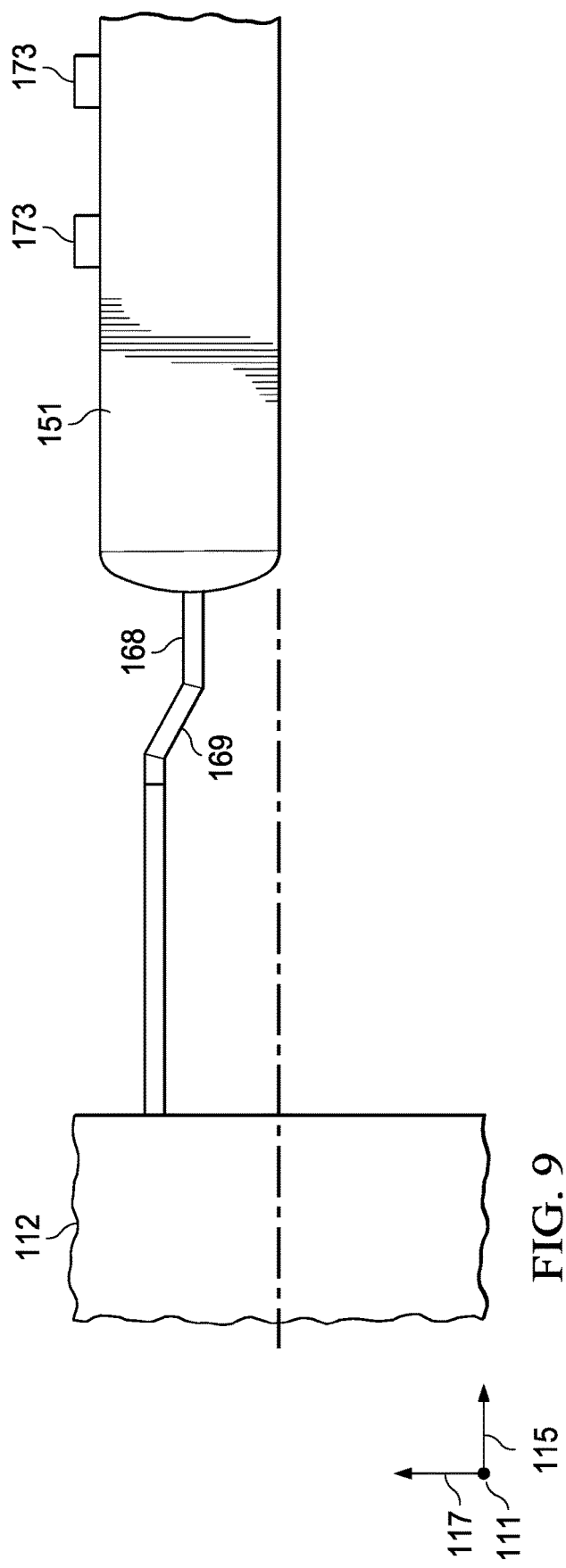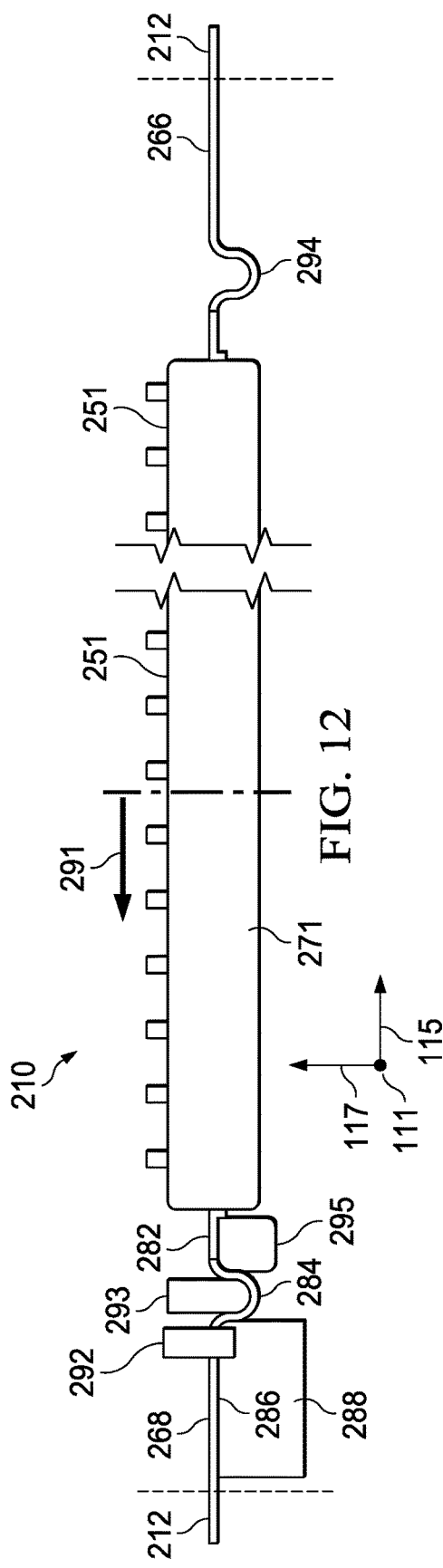

METHOD OF MAKING LEADFRAME STRIP

CROSS REFERENCE TO RELATED APPLICATIONS

This application is a division of Nonprovisional Patent Application Ser. No. 15/004,208, filed Jan. 22, 2016, the entirety of which is hereby incorporated herein by reference.

BACKGROUND

At the beginning of a typical process for making integrated circuit (IC) packages, leadframes that are to be included in the packages are integrally physically connected in a thin metal sheet known in the art as a "leadframe strip." IC dies are mounted on the leadframes and then wire bonded to leads of the leadframes, while the leadframes are in strip form. The leadframes of the strip and the dies mounted thereon are next encapsulated in mold compound. Subsequently, each encapsulated die/leadframe unit is separated (singulated) from the other units on the leadframe strip to provide individual IC packages. The singulation process for IC packages with exposed, outwardly extending leads ("leaded IC packages') is different than the singulation process for IC packages with leads that do not extend outwardly from the encapsulating mold compound.

SUMMARY

A leadframe strip for use in making leaded integrated circuit packages includes a plurality of integrally connected leadframes that each have a die attach pad and first and second dam bars located adjacent to opposite first and second sides of the die attach pad, respectively. A plurality of continuous lead structures extend, uninterrupted by other structure, between opposite ones of the dam bars of horizontally adjacent leadframes. The plurality of integrally connected leadframes are arranged in a plurality of vertical columns wherein die attach pads in one vertical column are vertically offset from die attach pads in adjacent columns.

BRIEF DESCRIPTION OF THE DRAWINGS

FIG. 7 is a front view of a portion of a molded leadframe strip before pitch correction.

FIG. 8 is a front view of a portion of a molded leadframe strip after pitch correction.

FIG. 9 is a front detail view of FIG. 7.

FIG. 12 is a broken, detail front view of one lateral half of the leadframe strip of FIGS. 10 and 11.

DETAILED DESCRIPTION

Figure 1:
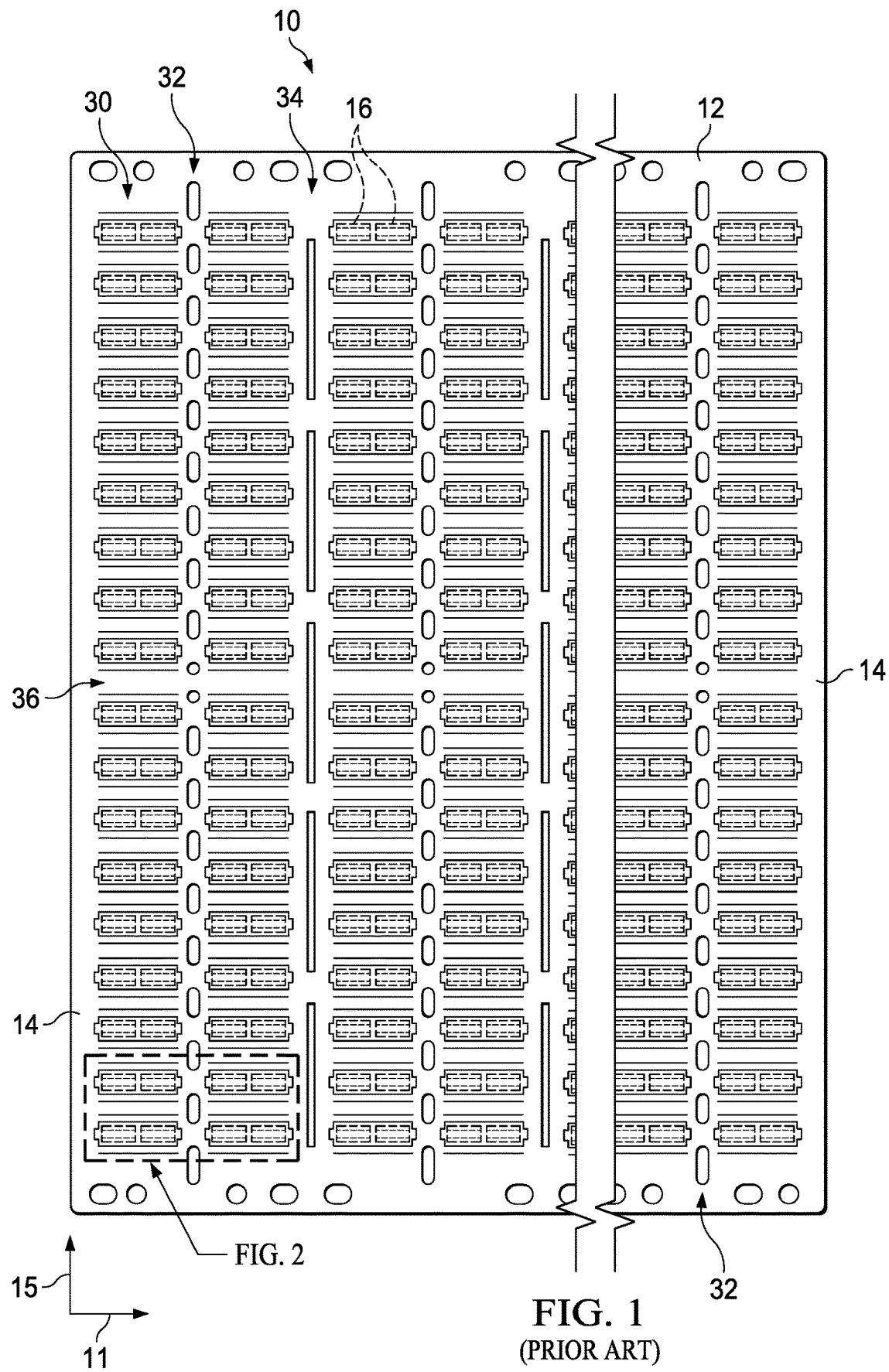
FIG. 1 is a broken front view of a prior art lead frame strip.

FIG. 1 is a front view of a prior art lead frame strip 10 having a horizontal axis 11 and a vertical axis 15. The frame of reference used to describe the leadframe strip 10 corresponds to that of a sheet of drawing where a direction between the top and bottom of the sheet is referred to as a "vertical" direction and the direction perpendicular to the vertical direction defines a "horizontal" direction. A direction perpendicular to the plane of the page is referred to as the "depth" or "thickness" direction. The "front" of the leadframe strip 10 is shown in the front view of FIG. 1 and is analogous to the front face of a sheet of paper.

Figure 2:
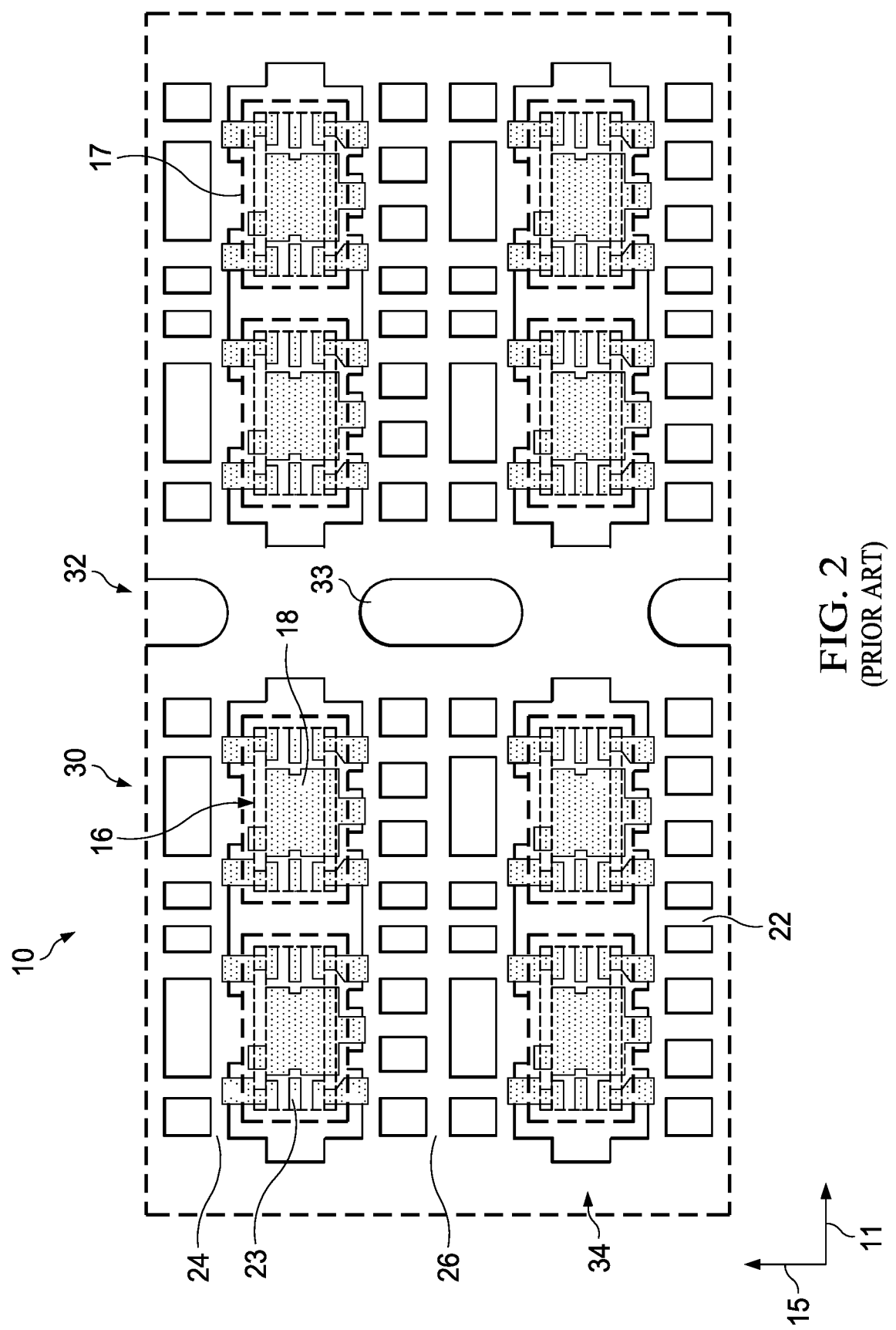
FIG. 2 is a detail view of a portion of FIG. 1.

The leadframe strip 10 comprises a pair of horizontal side rails 12 and a pair of vertical end rails 14. FIG. 2 is a detail view of a portion of FIG. 1. As best shown by FIG. 2, the leadframe strip 10 comprises a plurality of integrally connected leadframes 16 that are positioned inside an outer periphery of the strip defined by the horizontal side rails 12 and vertical end rails 14. Each leadframe 16 has a die attach pad 18 and a plurality of outer leads 22 (or simply "leads 22") and inner leads 23. The leads 22 extend outwardly from inner dam bars 24, which are positioned on opposite sides of each die attach pad 18. An outer dam bar 26 is positioned midway between vertically adjacent lead frames 16. The leads 22 that extend outwardly from each inner damn bar 24, extend to an associated outer dam bar 26. The distance between dam bars 24 of adjacent leadframes 16 is thus approximately the combined length of two opposed leads 22. As shown by both FIGS. 1 and 2, the leadframes 16 are arranged in vertical columns 30, with the leadframes 16 in adjacent vertical columns 30 positioned in horizontal alignment. Each pair of vertical leadframe columns 30 are positioned between a vertical mold runner 32 on one side and an interior vertical rail 34 on the other side. As illustrated by FIG. 1, a horizontally extending bone 36 is positioned at a vertical midpoint of the strip 10 and provides structural support thereto.

Figure 3:
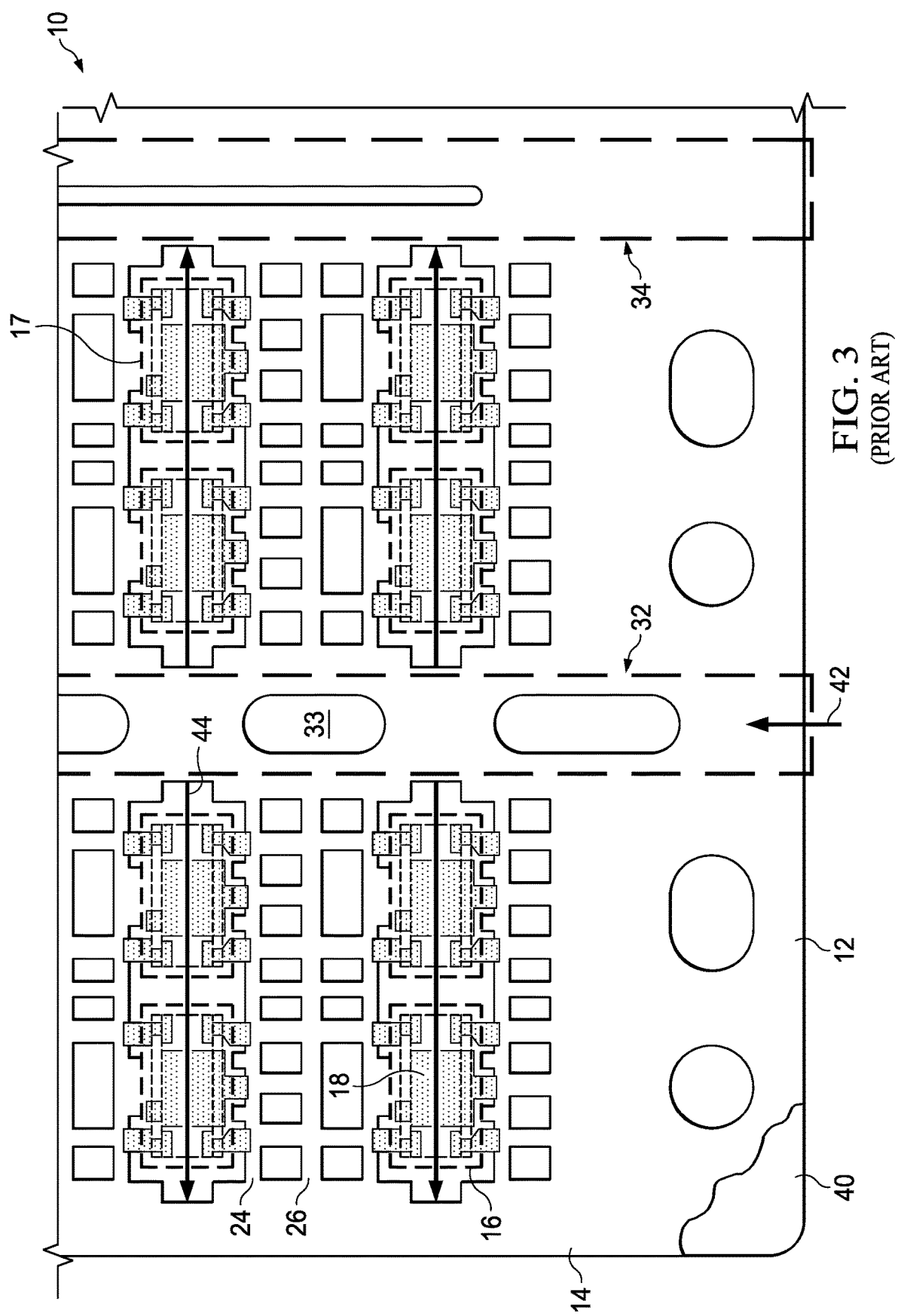
FIG. 3 is a detail front view of a prior art lead frame strip and mold platen illustrating the flow of mold compound onto the leadframe strip.

FIG. 3 is a detail front view of the prior art lead frame strip 10 and a mold platen 40 illustrating the flow direction 42 of mold compound onto the leadframe strip. The mold platen 40 in FIG. 3 is positioned beneath the leadframe strip 10, depth-wise. The mold compound flows vertically past the horizontally extending rail 12 and then through and vertically along each mold runner 32 and then horizontally as shown at 44 to partially cover aligned pairs of leadframes 16 positioned on opposite lateral sides of each mold runner 32. The dashed blocks shown in FIGS. 2 and 3 illustrate the boundaries of integrated circuit (IC) packages that will ultimately be formed by processes described herein. During subsequent processing the mold runners 32 and interior vertical rails and mold compound that covers these structures is cut away and scrapped (discarded). Thus, a significant amount of leadframe copper and mold compound is lost in this process of making leaded IC packages.

Figure 4:
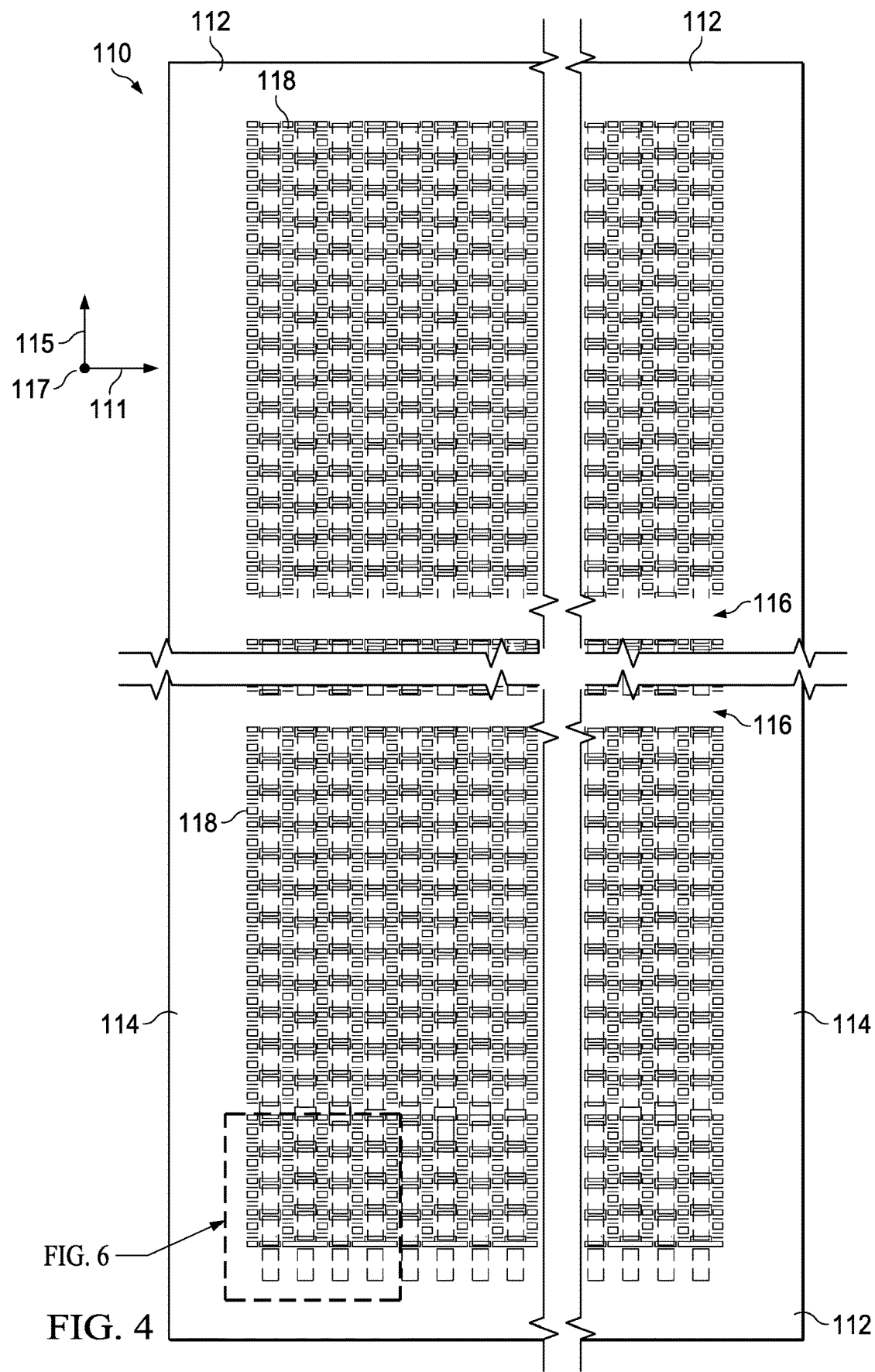
FIG. 4 is a broken front view of an example lead frame strip.

FIG. 4 is a front view of an example lead frame strip 110 having a horizontal axis 111 and a vertical axis 115 and an axis 117 perpendicular to the other axes 111, 115, i.e., in the depth direction. The leadframe strip 110 has opposite horizontal rails 112 and opposite vertical rails 114. Two horizontal bones 116 extend between the vertical rails 114 dividing the strip 110 into three approximately equal height portions. Depending upon the vertical dimension of a leadframe strip more or fewer vertical bones may be used. The bones 116 provide structural support to the leadframe strip 110. The leadframe strip 110 includes a plurality of integrally connected leadframes 118.

Figure 5:
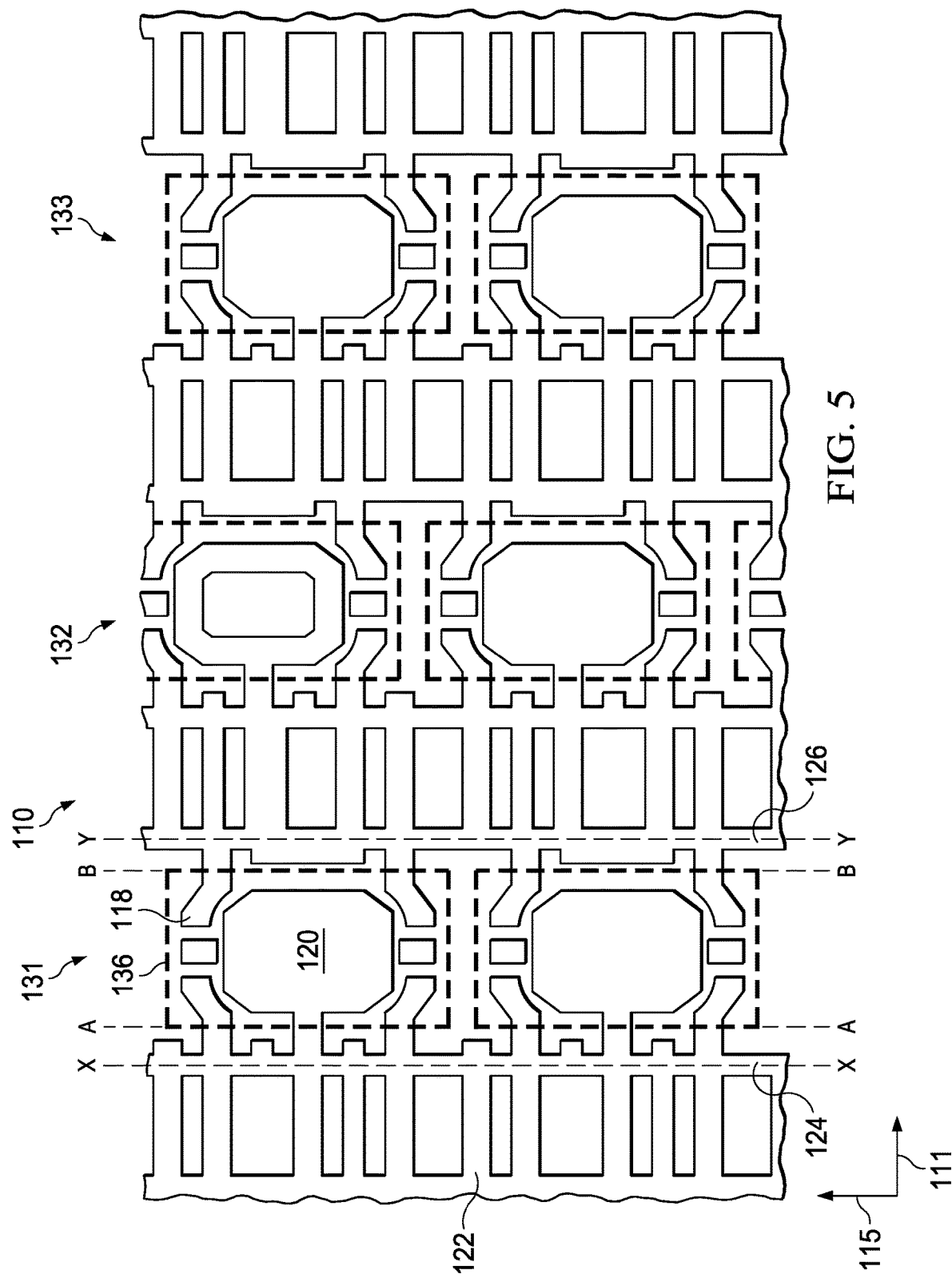
FIG. 5 is a front detail view of interconnected lead frames of the example lead frame strip of FIG. 1.

FIG. 5 is a front detail view of the example lead frame strip 110 of FIG. 4. As best shown by FIG. 5 the integrally connected leadframes 118 each comprise a die attach pad 120 and a plurality of leads 122. A first and second inner dam bar 124 and 126 are positioned on opposite lateral sides of each die attach pad 120. The leadframes 118 are arranged in a plurality of vertical columns 131, 132, 133, etc. The first inner dam bars 124 on the first side of each leadframe 118 are aligned in a column, e.g., column 131, which has a first vertical dam bar axis XX. The second inner dam bars 124 are vertically aligned along a second vertical dam bar axis YY. A dashed square 136 around each leadframe die attach pad 120 represents the shape of an IC package that will ultimately be formed in association with each leadframe 118. The outer dam bar structure such as shown at 26 in FIG. 2 has been eliminated. Also, the leadframes 118 in one vertical column, e.g., 131 are staggered vertically with respect to the leadframes 118 in an adjacent vertical column, e.g., 132. This staggering of leadframes enables the leads 122 of adjacent leadframes in adjacent columns to be interdigitated so that the leads of one leadframe extends from one of its dam bars to the dam bar of the adjacent leadframe, eliminating the need for an outer dam bar. This structure allows adjacent leadframe columns to be positioned more closely than the prior art structure shown in FIGS. 1-3 and thus enables more leadframes to be provided in a comparable space.

Figure 6:
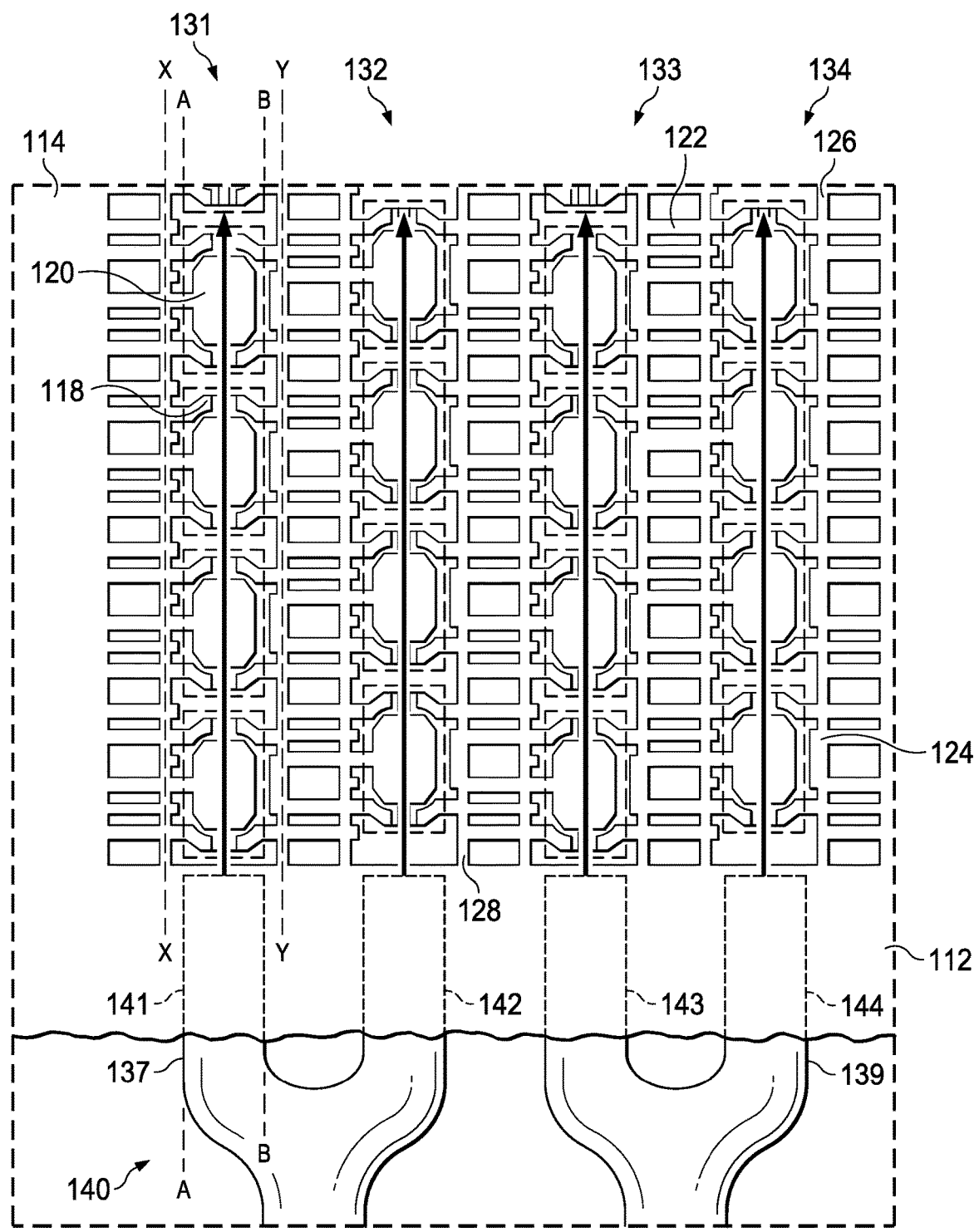
FIG. 6 is a front detail view of an example lead frame strip and mold platen illustrating the flow of mold compound onto the leadframe strip of FIG. 1.

FIG. 6 is a front detail view of an example lead frame strip 110 and a mold 140, illustrating the flow of mold compound from exterior mold runners 137, 139 onto the leadframe strip 110 shown in FIGS. 1 and 5. The mold 140 may be a transfer mold. Such molds are known in the art. Short length mold runners 141, 142, 143, 144, etc., are aligned with respective ones of the plurality of vertical columns 131, 132, 133, 134, etc. These mold runners 141, etc., are positioned, depthwise, immediately above or below one of the horizontal rails 112 and do not extend inwardly beyond the horizontal rail 112. Mold compound flows from each mold runner 141, etc. in direction 148 and covers the portion of each leadframe in each column that is positioned between axes AA and BB. Thus, in this configuration, the mold compound flows only in a vertical direction and vertical mold runner structures, such as shown at 32 in FIG. 1, and interior vertical rails such as shown at 34 in FIG. 1 are eliminated from the leadframe strip 110. Elimination of the mold runner structure and interior vertical rails makes more space available for leadframes in leadframe strip 110. Thus, the elimination of mold runner structures and vertical rails from the inner portion of the leadframe 110, in combination with the space saving features described in the immediately preceding paragraph, allows a leadframe strip 110 to be provided that has a much denser leadframe configuration, i.e., more leadframes per unit area than the prior art leadframe 10 of FIGS. 1-3. The meaning of "vertical," as used herein, is not dependent upon which side of the leadframe sheet is longer. Rather, the term "vertical," as used herein, refers to the direction in which succeeding leadframes, which are linearly aligned in a column, extend.

FIG. 7 is a front view of a portion of a leadframe strip 150 after molding, as described above, and after conventional dam bar cutting, lead cutting, and lead forming. Such dam bar cutting and lead cutting in the fabrication of leaded IC packages is known in the art. Accordingly, those processes will not be further described. The leadframe 150 of FIG. 7 comprises molded leadframe columns 151, 152, 153 and 154. Each odd column 151, 153 comprises a molded portion 171 and outwardly projecting leads 173. Each even column 152, 154 comprises a molded portion 174 and outwardly projecting leads 176. Adjacent ones of columns 151-154 have vertically offset leadframes as described above with reference to FIGS. 4-6. Odd columns 151 and 153, etc., have leadframes that are laterally aligned. Even columns 152 and 154, etc., also have leadframes that are laterally aligned. The leads 173 of the odd columns in FIG. 7 are vertically offset from the leads 176 of the even columns. The inventors have discovered a method by which all columns 151-154 may be positioned with the leads 173 and 176 and the corresponding molded leadframe portions of each column arranged in lateral alignment, as will now be described.

With continued reference to FIG. 7 it may be seen that the odd columns 151, 153, etc. are positioned with the lower ends 162 thereof further from the bottom rail 112 and with the upper ends 164 thereof closer to the top rail 112 than the even leadframes 152, 154, etc. Each of the leadframe columns is connected to the lower rail 112 by lower extensions 166 of the dam bar columns and to the upper rail 112 by upper extensions 168 of the dam bar columns.

In FIG. 8 the odd columns 151, 153 and even columns 152, 154 have been relatively vertically displaced such that the leadframes thereof including corresponding ones of leads 171 and 176 are now laterally aligned. In one embodiment this is done by moving odd columns 151 and 153 relatively downwardly. In another embodiment it is done by moving even columns 152, 154 relatively upwardly. In another embodiment odd columns are moved downwardly and even columns are moved upwardly to achieve alignment. Such upward or downward movement may be achieved through shortening the connecting dam bar structures at one end of a column and lengthening it at the other end. Such shortening and lengthening of the dam bar or associated structures may be achieved by increasing the bend therein for shortening and by straightening the bend therein for lengthening. (The bends in the dam bar extension structures 166, 168 is not shown in FIGS. 7 and 8, but are shown and described in detail with reference to FIG. 9)

FIG. 9 is a front detail view of one lateral half of a molded column, e.g. 171, of FIG. 7, showing one dam bar extension structure 168, having a down set portion 169, connected to one of the horizontal rails 112. The other lateral half of the molded column, e.g., 151, shown in FIG. 8, is a mirror image of the lateral half shown. By straightening the down set portion 169, the dam bar extension structure 168 may be lengthened. By further bending the down set portion 169 the structure 168 may be shortened. Thus, the associated molded column, e.g. column 151, may be selectively shifted upwardly or downwardly by increasing the bend in the down set portion 169 at one end thereof while straightening the down set portion 169 at the other end. The dam bar or other connecting structure at each end of the column, e.g., 151, must initially be formed with some sort of bent portion in order to accomplish this upward or downward displacement of the corresponding column, e.g. 151.

Figure 11:
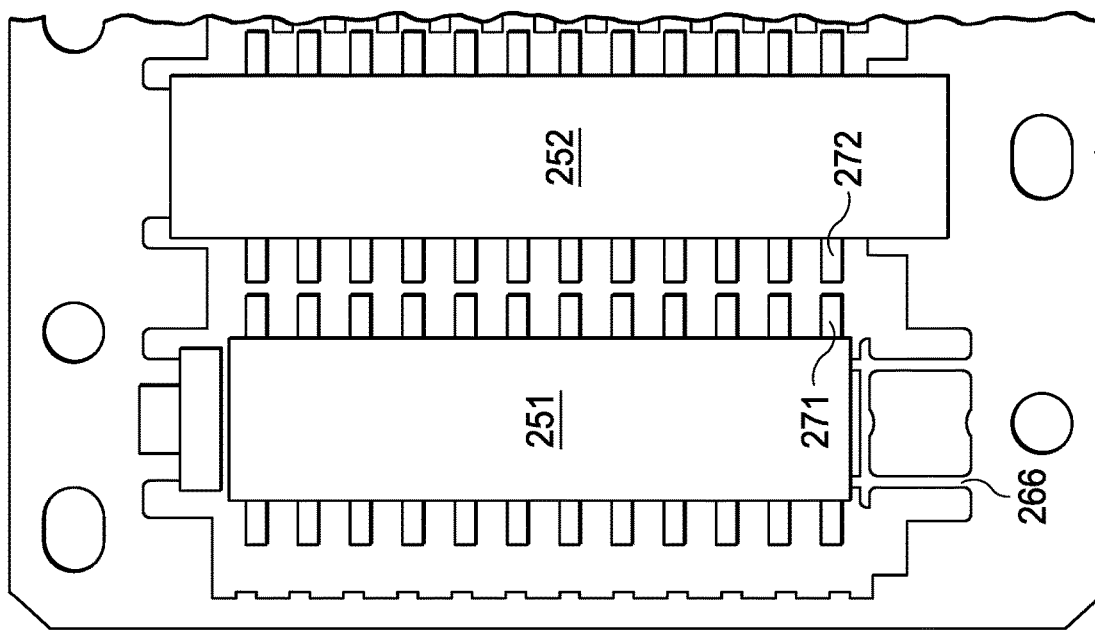
FIG. 11 is a front view of the example leadframe strip of FIG. 10 after pitch correction.
Figure 10:
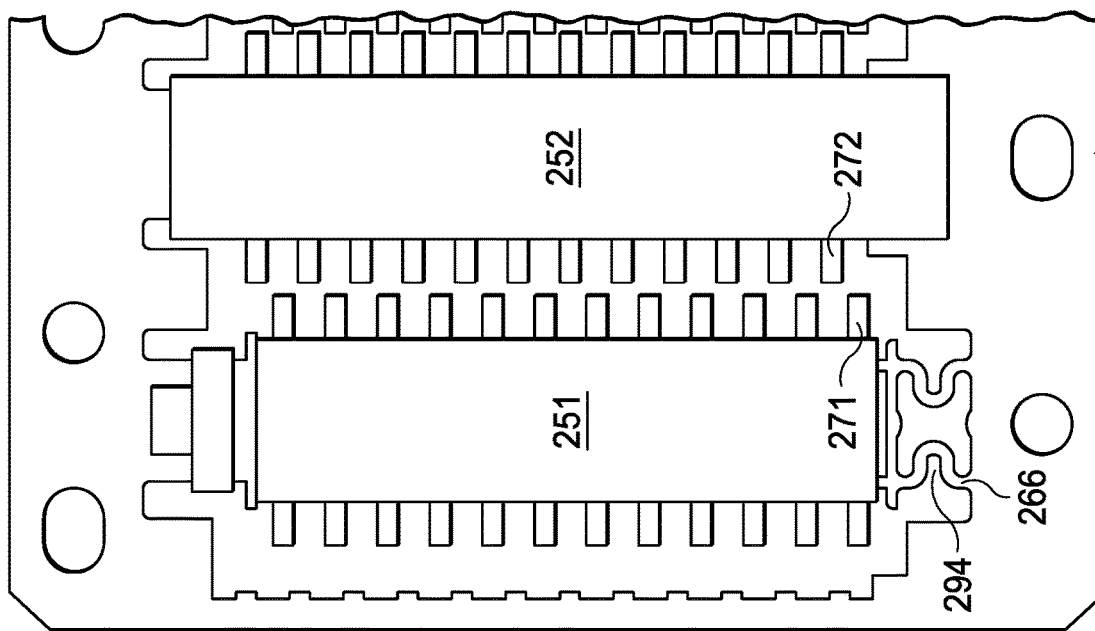
FIG. 10 is a front view of another example lead frame strip, after molding and lead separation and before pitch correction.

FIG. 10 is a front view of another example lead frame strip 210, after molding and lead separation and before pitch correction. FIG. 11 is a front view of the example leadframe strip of FIG. 10 after pitch correction. FIG. 12 is a broken, detail front view of one lateral half of the leadframe strip of FIGS. 10 and 11. As shown by FIGS. 10 and 12, strip 210 has a first molded leadframe column 251 connected to a lower rail 212 by mirror image dam bar extensions 266 at one end and similar or identical dam bar extensions 268 (not visible in FIGS. 10 and 11) at the other end. FIG. 12 shows details of a structure used for increasing the bend in dam bar 268. As shown by FIG. 12, the dam bar structure 268 has a straight portion 282 adjacent the molded portion 271, which is connected to a generally U-shaped portion 284, which is connected to a relatively straight portion 286. The relatively straight portion 286 is integrally connected to the horizontal rail 212. A holding assembly includes a block member 288 and a clamping member 292 that firmly holds straight portion 268 in stationary relationship therewith. A displaceable punch member 293 may be urged against the U-shaped portion 284, increasing the depth thereof and pulling the molded column 251 in direction 291 across an insert block 295. The movement of the molded column 251 in direction 291 causes a corresponding straightening of a U-shaped portion 294 of the dam bar structure 266 at the opposite end of the molded column 251.

Figure 13:
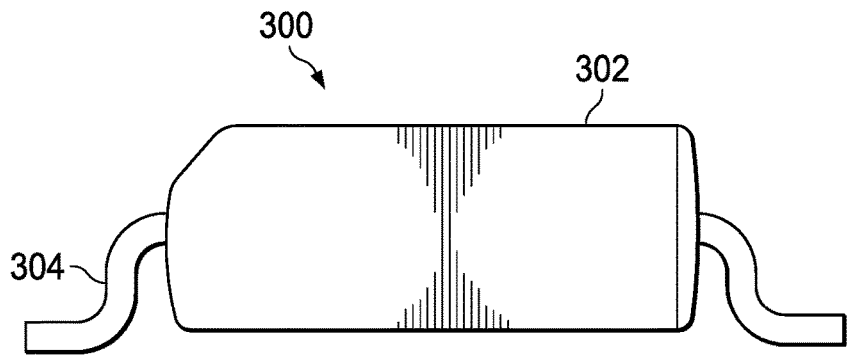
FIG. 13 is an end view of an integrated circuit package singulated from a molded lead frame strip such as shown in FIG. 8 or FIG. 11.
Figure 14:
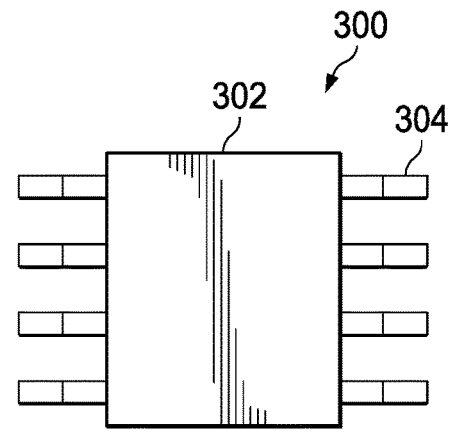
FIG. 14 is a front view of the integrated circuit package of FIG. 13.

As shown by FIG. 11, as a result of the displacement of column 251, the two columns 251 and 252 are now pitch corrected, i.e., have corresponding leads 271 and 272 thereof in lateral alignment. The columns 251 and 252 may now be singulated by one or more saw cuts (not shown in FIGS. 10 and 11) to produce singulated integrated circuit packages 300 having molded portions 302 and lead portions 304, such as shown in FIGS. 13 and 14, which are end and rear views thereof, respectively.

Figure 15:
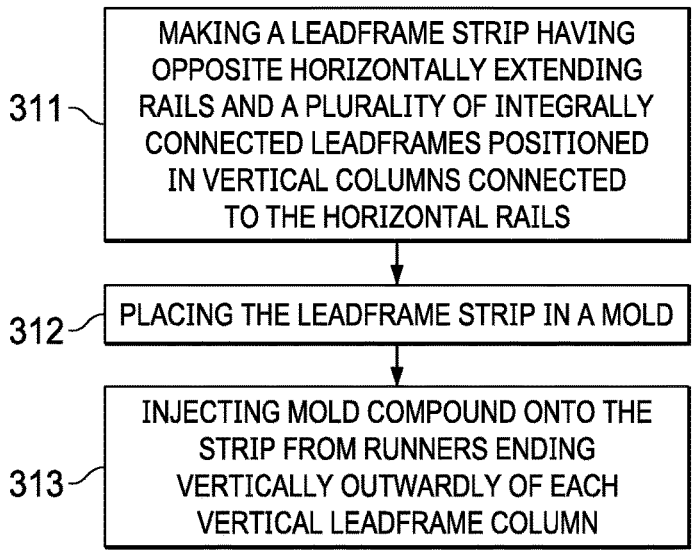
FIG. 15 is a flowchart of a method of making integrated circuit packages.

FIG. 15 is a flow chart of a method of making integrated circuit packages. The method includes, as shown at block 311, making a leadframe strip having opposite horizontally extending rails and a plurality of integrally connected leadframes positioned in vertical columns connected to the horizontal rails. The method further includes, as shown at block 312, placing the leadframe strip in a mold. The method also includes, as shown at block 313, injecting mold compound onto the strip from runners ending vertically outwardly of each vertical leadframe column.

Embodiments of a novel leadframe strip and methods of using such a strip to make integrated circuit packages have been described in detail herein. Alternate embodiments of such a leadframe strip and associated methods of making integrated circuit packages will occur to those skilled in the art after reading this disclosure. It is intended that the appended claims be construed to cover all such alternative embodiments, except as limited by the prior art.

What is claimed is:

1. A method of making leaded integrated circuit packages comprising:
placing a leadframe strip in a mold, the leadframe strip including opposite horizontally extending rails and a plurality of connected leadframes positioned in vertically extending leadframe columns connected to the horizontally extending rails; and
injecting mold compound onto the leadframe strip from vertically extending runners positioned below one of the horizontally extending rails and terminating vertically outwardly of the plurality of connected leadframes.

2. The method of claim 1, wherein said injecting comprises covering at least portions a die attach pad of each leadframe of the plurality of connected leadframes with, mold compound.

3. The method of claim 1 wherein said injecting comprises covering at least portions of a die attach pad and lead portions of each leadframe of the plurality of connected leadframes, with mold compound.

4. The method of claim 1 further comprising laterally separating the vertically extending leadframe columns by cutting leads connecting adjacent columns.

5. The method of claim 4 further comprising performing pitch correction on the vertically extending leadframe columns while the columns are attached to the opposite horizontally extending rails.

6. The method of claim 5 wherein said performing pitch correction comprises bending dam bar extension structures connecting the vertically extending leadframe columns to the horizontal rails to move adjacent columns into a horizontal alignment.

7. The method of claim 5 wherein said performing pitch correction comprises bending dam bar extension structures extending from the vertically extending leadframe columns to move adjacent columns in opposite horizontal directions.

8. The method of claim 5 wherein said performing pitch correction comprises bending dam bar extension structures extending from each of the vertically extending leadframe columns.

9. The method of claim 8 wherein said bending comprises punch bending at least one of dam bar extension structures extending from each of the vertically extending leadframe columns.

10. The method of claim 5 wherein said performing pitch correction comprises bending dam bar extension structures on every other one of the vertically extending leadframe columns.

11. The method of claim 5 further comprising singulating the plurality of vertically extending leadframe columns, that are pitch corrected molded, by performing a plurality of parallel horizontally extending cuts extending across multiple columns of the plurality of vertically extending leadframe columns.

12. The method of claim 1, wherein said injecting comprises covering at least two die attach pads of two leadframes of the plurality of connected leadframes that are adjacent to and offset from each other with mold compound.

13. A method of making leaded integrated circuit packages comprising:
placing a leadframe strip in a mold, the leadframe strip including a plurality of leadframes, each leadframe of the plurality of leadframes including a die attach pad and a set of leads, the plurality of leadframes arranged in columns that are in a first direction, at least one end of the columns including at least one mold runner aligned with the die attach pads of the plurality of leadframes in the columns; and
injecting mold compound onto the leadframe strip through the at least one mold runner.

14. The method of claim 13, wherein injecting mold compound comprises injecting the mold compound to the mold runner that is aligned with the die attach pad of each leadframe in the first direction.

15. The method of claim 13 further comprising laterally separating the columns by cutting the set of leads connecting columns that are adi acent.

16. The method of claim 15 further comprising performing pitch correction on the columns while the columns are attached to the opposite extending rails that are in a second direction, the second direction being at an angle with respect to the first direction.

17. The method of claim 16 wherein performing pitch correction comprises bending dam bar extension structures connecting columns to the opposite extending rails.

18. The method of claim 16 wherein performing pitch correction comprises bending dam bar extension structures on every other one of the columns.

19. The method of claim 18 further comprising singulating the columns by performing a plurality of cuts extending across the columns in the second direction.

\* \* \* \* \*